LAWRENCE D. DILLARD
INVENTOR
BY
BUCKHORN, BLORE, KLARQUIST & SPARKMAN
ATTORNEYS

United States Patent Office 3,339,088
Patented Aug. 29, 1967

3,339,088
RAMP VOLTAGE GENERATOR HAVING DISABLING GATE CONTROLLED BY RAMP DETECTOR CIRCUIT

Lawrence D. Dillard, Portland, Oreg., assignor to Tektronix, Inc., Beaverton, Oreg., a corporation of Oregon
Filed Nov. 30, 1964, Ser. No. 414,551
7 Claims. (Cl. 307—88.5)

Figure 1:
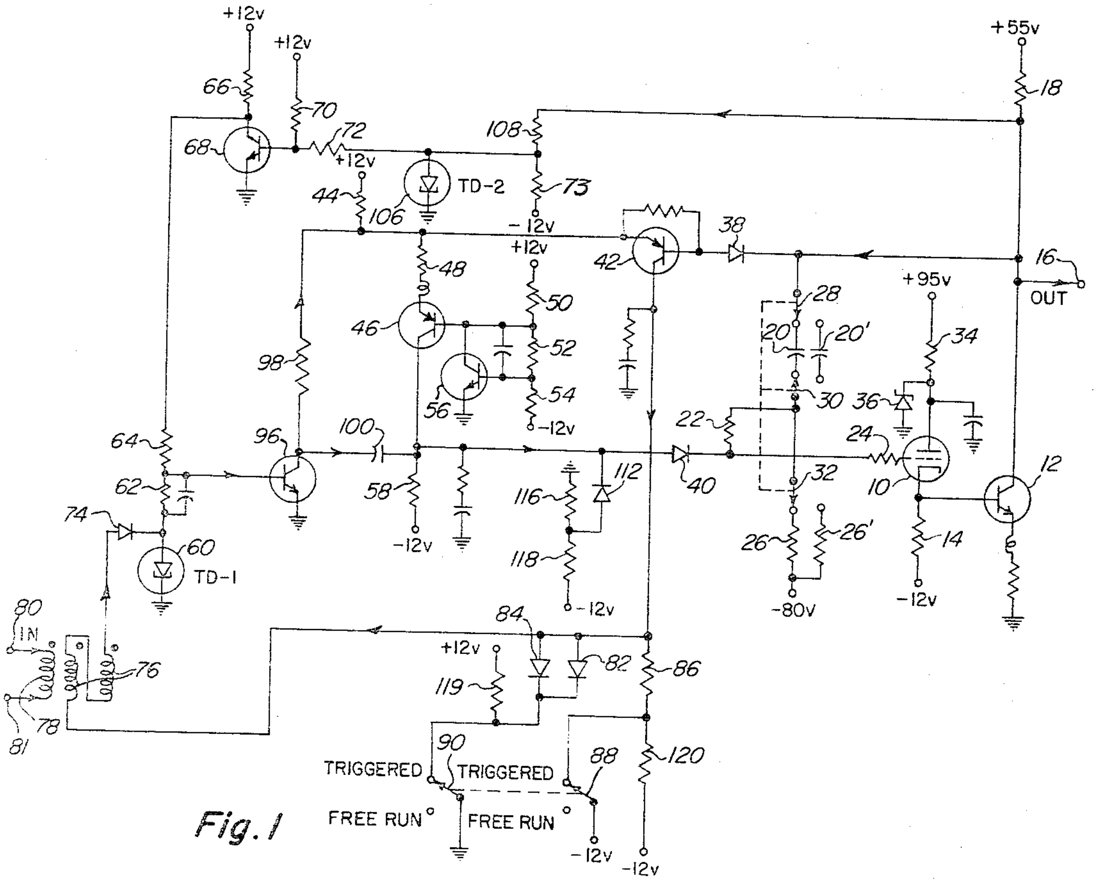

The subject matter of the present invention relates generally to linear ramp or saw-tooth voltage generator circuits, and specifically to a ramp generator circuit which employs a disabling gate connected to the input terminal of such circuit whose conduction is controlled by a ramp detector circuit. The detector circuit includes an electronic switch which renders the disabling gate nonconducting immediately after an input trigger pulse is transmitted through such gate to start the production of a ramp voltage, and maintains such gate nonconducting until such ramp voltage terminates to prevent retriggering of the ramp generator until after such generator has completely returned to its quiescent operating level.

The ramp generator circuit of the present invention is especially useful when employed as the horizontal sweep generator of a cathode ray oscilloscope, but may be used in radar apparatus, electronic computers or other apparatus requiring a linear ramp voltage signal. The present ramp generator circuit is an improvement over the circuit disclosed in U.S. Patent 3,138,764 by Oliver Dalton et al. which issued June 23, 1964.

The ramp generator circuit of the present invention has several advantages over conventional ramp generators including a jitter-free triggering operation in which the ramp generator is prevented from being retriggered until the ramp voltage has completely returned to its quiescent voltage level. Many conventional ramp generators employ a portion of the ramp voltage as a hold-off signal to prevent a bistable ramp gating multivibrator, which is triggered to start the production of such ramp voltage, from being retriggered until after the ramp voltage has terminated. In order to accomplish this, the trailing edge of the ramp voltage is delayed or "stretched" in a hold-off circuit to provide the hold-off signal with a trailing edge of longer fall time which returns to a quiescent value subsequent to the ramp voltage. As a result, there is a time delay between the termination of the ramp voltage and the time when the ramp gating multivibrator is able to be triggered again. This time delay reduces the maximum repetition frequency of the ramp generator accordingly. In addition, since the hold-off signal has a long fall time, it is possible that an input trigger signal can be applied to the multivibrator simultaneously with the trailing edge of the hold-off signal before such trailing edge has reached its quiescent value but at a time when their voltage sum is of sufficient amplitude to trigger the multivibrator. As a result, the next ramp voltage can be produced at a different time with respect to the start of its trigger pulse than the previous ramp voltage to cause "jitter" in the ramp voltage signals.

The above disadvantages are overcome by the ramp generator circuit of the present invention because immediately after its gating oscillator is triggered, the disabling gate is rendered nonconducting and is not returned to a conducting state until after the ramp voltage has terminated and the ramp generator is completely recovered. The disabling gate is returned to a conducting state immediately after the termination of the ramp voltage by a detector circuit which detects such termination, thereby eliminating any appreciable time delay between the end of the ramp voltage and time when the gating oscillator is able to be triggered again to increase the maximum repetition frequency of the ramp generator.

Also, such gate is rendered conducting by the trailing edge of a rectangular voltage pulse whose trailing edge has a short fall time to prevent the occurrence of a trigger pulse simultaneously with such trailing edge and thereby to reduce time jitter. In addition, the present ramp generator employs a comparator circuit to maintain the quiescent D.C. voltage level of the ramp signal substantially constant and to cause the disabling gate to be rendered conducting only after the ramp voltage returns to such quiescent level. Furthermore, the ramp generator of the present invention is simpler and less expensive than previous ramp generators because it does not employ a hold-off circuit.

It is therefore one object of the present invention to provide an improved triggered ramp generator circuit of simple and inexpensive construction which produces linear ramp voltages having a substantially constant quiescent D.C. voltage level.

Another object of the invention is to provide an improved ramp generator, which once it has been triggered cannot be retriggered until the ramp voltage has completely returned to its quiescent value and then is immediately "enabled" with no appreciable time delay after the termination of the ramp voltage by detecting such termination, to increase the maximum repetition frequency of the ramp generator.

A further object of the present invention is to provide an improved ramp generator which does not employ a hold-off circuit to prevent retriggering of the ramp generator until the previous ramp voltage terminates, but accomplishes this in a simpler and less expensive manner to provide a more jitter-free operation by means of a disabling gate controlled by an electronic switch in a ramp voltage detector circuit.

An additional object of the present invention is to provide an improved time base sweep generator for a cathode ray oscilloscope which can be triggered to produce a linear ramp voltage which is jitter free and has a substantially constant quiescent D.C. voltage level.

Figure 2:
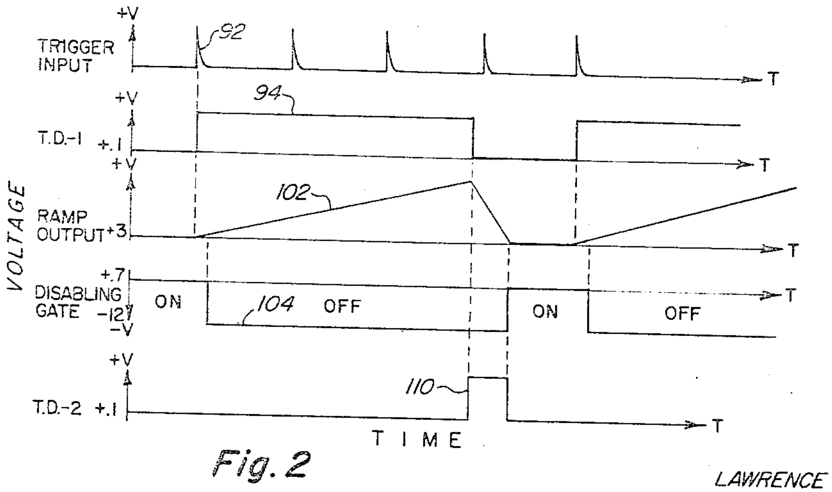

Other objects and advantages of the present invention will be apparent from the following detailed description of one embodiment of the present invention and from the attached drawings of which:

FIG. 1 is a schematic diagram of one embodiment of the ramp generator circuit of the present invention; and FIG. 2 shows the waveforms of the signal applied to and produced by the ramp generator circuit of FIG. 1, in time relationship to one another.

As shown in FIG. 1, one embodiment of the present ramp generator employs a hybrid Miller integrator circuit similar to that shown in U.S. Patent 3,138,764, referred to above, to produce a linear ramp voltage. The Miller integrator circuit includes a triode vacuum tube 10 of the "Nuvistor" type connected as a cathode follower amplifier input stage and a transistor 12 of the NPN type connected as a grounded emitter amplifier output stage, with its base connected to the cathode of such tube across a load resistor 14 of about 4.3 kilohms, whose other terminal is connected to a negative D.C. supply voltage of −12 volts. The collector of transistor 12 is connected to a positive D.C. supply voltage of +55 volts through a load resistor 18 of about 7.5 kilohms and to an output terminal 16. A timing capacitor 20 is connected from the collector of transistor 12 to the grid of tube 10 through a pair of coupling resistors 22 and 24 of 10 ohms and 27 ohms, respectively, in order to provide negative A.C. voltage feedback from the output to the input of the Miller integrator. The timing capacitor 20 is connected in series with a charging resistor 26 to a negative D.C. supply voltage of −80 volts by means of a plurality of ganged selector switches 28, 30 and 32 which may be switched between a plurality of timing capacitors and charging resistors of different value in order to vary the slope of the leading edge of the ramp voltage produced by the Miller integrator circuit. The anode of tube 10 is connected to a positive D.C. supply voltage of +95 volts through a load resistor 34 of 3.3 kilohms and is connected to the cathode of a Zener diode 36 whose anode is grounded in order to clamp the voltage on such anode to approximately ground potential.

The Miller integrator circuit is gated through a pair of disconnect diodes 38 and 40 having their cathodes connected to the opposite terminals of the timing capacitor 20. The anode of disconnect diode 38 is connected to the base of a switching transistor 42 of the PNP type which detects the end of the ramp voltage and opens a disabling gate in a manner hereafter described. The emitter of the switching transistor is connected to a source of positive D.C. supply voltage of +12 volts through a load resistor 44 of 1.27 kilohms so that such switching transistor is normal biased conducting. The anode of disconnect diode 40 is connected to the collector of a normally conducting comparator transistor 46 of the PNP type whose emitter is connected to the load resistor 44 through a resistor 48 of 18 ohms. Thus, the transistors 42 and 46 and disconnect diodes 38 and 40 provide a negative feedback path from the output to the input of the Miller integrator when these elements are all conducting during the quiescent operating state of the ramp generator.

The base of the comparator transistor 46 is connected to a voltage divider, including three series resistors 50, 52 and 54 of 2 kilohms, 3.01 kilohms and 12.7 kilohms, respectively, connected between sources of D.C. supply voltage of +12 and −12 volts. A voltage clamping transistor 56 of the NPN type has its base connected to the common terminal of resistors 52 and 54, its emitter grounded, and its collector connected to the common terminal of resistors 50 and 52 so that such transistor is normally biased conducting. Thus, transistor 56 maintains a substantially constant voltage of about +.7 volt on the common terminal of resistors 52 and 54. This causes a current to flow through resistor 54 of about 1 milliampere and sets the voltage at the common terminal of resistors 50 and 52 at about +3.7 volts which is the reference voltage applied to the base of the comparator transistor.

A load resistor 58 of 10.2 kilohms is connected between the collector of the comparator transistor 46 and a source of negative D.C. supply voltage of −12 volts, and the voltage drop across such load resistor normally biases the disconnect diode conducting. As a result, the current flowing in the charging resistor 26 is normally transmitted through the disconnect diode 40, resistor 58, comparator transistor 46 and load resistor 44 to prevent the timing capacitor 20 from charging at this time.

A first tunnel diode 60, connected as a bistable oscillator, normally biased in its low voltage state, is provided to gate the Miller integrator "on." The cathode of the first tunnel diode is grounded while its anode is connected through series load resistors 62, 64 and 66 of 300 ohms, 4.42 kilohms and 4.42 kilohms, respectively, to a source of positive D.C. supply voltage of +12 volts. A transistor 68 of the NPN type is also connected to the load resistor 66 through its collector and has its emitter grounded so that the conductive condition of such transistor controls the amount of D.C. bias current supplied to tunnel diode 60. The base of transistor 68 is connected to a positive D.C. supply voltage of +12 volts through a resistor 70 of 24.3 kilohms and to a source of negative D.C. supply voltage of −12 volts through resistors 72 and 73 of 820 ohms and 22.1 kilohms, respectively to provide a bias voltage on its base which renders such switching transistor normally nonconducting. This causes the bias current of the tunnel diode 60 to be slightly less than the peak current point of such tunnel diode and biases it in a low voltage state.

The anode of the tunnel diode 60 is connected to the cathode of a disabling diode 74 having its anode connected to one terminal of a secondary winding 76 of a transformer whose primary winding 78 is connected through a pair of input terminals 80 and 81 to a source of input trigger pulses. The other terminal of the secondary winding 76 is connected to the collector of the switching transistor 42 and to the anodes of a pair of voltage clamping diodes 82 and 84. A collector of the switching transistor 42 is connected to a negative D.C. supply voltage of −12 volts through a load resistor 86 of 4.32 kilohms and a selector switch 88 in the "Triggered" position of such switch shown in FIG. 1. Another selector switch 90 connects the cathodes of clamping diodes 82 and 84 to ground in its "Triggered" position and is ganged to switch 88. Since the clamp diodes 82 and 84 are normally biased conducting by the voltage drop across load resistor 86, they apply a small positive D.C. voltage of about +.7 volt to the anode of disabling diode 72 which normally biases such disabling diode conducting due to the fact that its cathode is at approximately ground potential because of the low voltage drop of about 0.1 volt across the tunnel diode 20 at this time. Thus, the disabling diode 74 is a normally conducting gate which transmits positive pulses applied to input terminal 80, or negative pulses applied to input terminal 81 as positive trigger pulses 92 to the anode of tunnel diode 60.

The trigger pulse triggers tunnel diode 60 into its high voltage stable state and produces a positive step voltage 94 on the anode of such tunnel diode, as shown in FIG. 2. The positive step voltage 94 is applied to the base of a transistor 96 of the NPN type, normally biased nonconducting and connected as a grounded emitter amplifier. The collector of transistor 96 is connected through a coupling resistor 98 of 430 ohms to the emitter of comparator transistor 46 to provide a low frequency signal path through such comparator transistor to the disconnect diode 40 for the negative step voltage pulse produced when transistor 96 is rendered conducting by the voltage pulse 94. In addition, the collector of transistor 96 is also connected through a coupling capacitor 100 of about 10 microfarads to the anode of disconnect diode 40 in order to provide a high frequency signal path for the leading edge of the negative step voltage pulse to such disconnect diode. Thus, when transistor 96 is rendered conducting by the positive step voltage 94, it transmits a negative step voltage to the anode of disconnect diode 40 which renders such disconnect diode nonconducting. This immediately causes the current flowing through charging resistor 26 to begin charging the timing capacitor 20 so that a positive going ramp voltage 102 is produced across such capacitor and at the output terminal 16 of the Miller integrator circuit.

A portion of this positive going ramp voltage is applied to the cathode of disconnect diode 38 which insures that such diode is rendered nonconducting after the start of such ramp voltage and maintains the diode nonconducting for the duration of the ramp voltage. However, it should be noted that the negative step voltage produced on the collector of transistor 96 is also transmitted to the emitter of the switching transistor 42 and tends to render such switching transistor, as well as disconnect diode 38, nonconducting if this has not already been accomplished by the ramp voltage.

When the switching transistor 42 is rendered nonconducting, a negative going step voltage is produced on the collector of such transistor having an amplitude of about −12 volts. This negative step voltage is applied to the anode of the gating diode 74 as a disabling pulse 104 to render such diode nonconducting, as shown in FIG. 2. As a result, the trigger pulses 92 are no longer transmitted through the gating diode 74 to the tunnel diode 60, and this condition persists until the disabling pulse 104 terminates at the end of the ramp voltage.

A second tunnel diode 106 may be provided having its cathode grounded and its anode connected to the common terminal of resistors 72 and 73 so that such tunnel diode is connected as a bistable oscillator, normally biased in a low voltage state. The output of the Miller integrator circuit is connected to the anode of the second tunnel diode through a resistor 108 of 31.6 kilohms in order to transmit a portion of the ramp signal to such tunnel diode. When the ramp voltage 102 reaches a maximum of about +33 volts, the second tunnel diode 106 is triggered to its high voltage stable state to produce a positive step voltage 110 on its anode. This positive step voltage is applied to the base of transistor 68 and switches such transistor "on" so that a negative going step voltage is transmitted from the collector of such transistor to the anode of the first tunnel diode and reverts such tunnel diode to its initial low voltage state. This negative step voltage also renders transistor 96 nonconducting and causes such transistor to transmit a positive step voltage to the anode of disconnect diode 40, thereby rendering such disconnect diode conducting and causing the storage capacitor 20 to rapidly discharge through such diode. However, the positive step voltage applied to the emitter of switching transistor 42, as a result of the reversion of the first tunnel diode, is not of sufficient amplitude to render such switching transistor conducting because the ramp voltage applied to the cathode of the disconnect diode 38 is highly positive at this time.

It should be noted that if the first tunnel diode 60 and transistor 96 are carefully selected, the second tunnel diode 106 can be eliminated and the ramp voltage transmitted through transistor 68 to revert the first tunnel diode 60. However, it is possible that the transistor 96 can be rendered conducting before the first tunnel diode is reverted, and such transistor will transmit the ramp voltage as a negative feedback signal back to the input of the Miller integrator and render the disconnect diode 40 conducting to terminate the leading edge of the ramp voltage before it reaches a sufficient voltage to revert the first tunnel diode. The use of the second tunnel diode prevents this from ever happening.

As the timing capacitor 20 discharges through the disconnect diode 40, the ramp voltage 102 at output terminal 106 decreases toward its quiescent D.C. level of +3 volts and reverts the second tunnel diode. When the ramp voltage reaches its quiescent value, the disconnect diode 38 is rendered conducting to turn "on" the switching transistor 42. As a result of the switching of transistor 42 to a conducting state, the voltage on the collector of such transistor rapidly increases to a quiescent value of +.7 volt, determined by the voltage drop across the clamping diodes 82 and 84. This terminates the disabling pulse 104 which turns the gating diode 74 back "on" and completes one cycle of operation.

Since the first tunnel diode 60 cannot be retriggered during the return of the ramp voltage to its quiescent value due to the disabling diode 74 being rendered nonconducting at that time to prevent the passage of trigger pulses 92, the ramp generator circuit cannot be triggered until it has completely recovered. Also, the short fall time of the trailing edge of the disabling pulse prevents the first tunnel diode from being triggered at different amplitudes of the trigger pulse and thereby reduces time jitter in the ramp output signals with respect to the trigger pulses producing such output signals.

A limiting diode 112 is provided with its cathode connected to the anode of disconnect diode 40 and its anode connected between a pair of series voltage divider resistors 116 and 118 of 750 ohms and 11 kilohms respectively. The voltage divider resistors 116 and 118 are connected between ground and a negative D.C. supply voltage of −12 volts to apply a small negative voltage to the anode of diode 112 so that such diode is rendered conducting when a slightly more negative voltage is applied to its cathode. This limits the amount of negative voltage applied to the anode of disconnect diode 40 to prevent such disconnect diode from being damaged.

It should be noted that the switching transistor 42 and the comparator transistor 46 function as a detector circuit to determine when the ramp voltage 102 returns to its quiescent D.C. voltage level by comparing the D.C. reference voltage on the base of the comparator transistor with the ramp voltage. The switching transistor is rendered conducting when the ramp voltage reaches its quiescent value of about +3 volts because the reference voltage is +3.7 volts on the base of the comparator transistor, and the forward bias voltages across the emitter junctions of transistors 42 and 46 are approximately equal and of opposite polarity. In addition, transistors 42 and 46 also function as amplifiers during the quiescent condition of the ramp generator to increase the amplitude of negative voltage feedback signals transmitted from the output to the input of the Miller integrator in order to maintain the D.C. output voltage of such integrator substantially constant.

In addition to operating as a triggered ramp generator, the present circuit can also be operated as a free-running ramp generator by opening the selector switches 88 and 90 to the "Free Run" position. In the "Free Run" position of the selector switches 88 and 90, the cathodes of clamping diodes 82 and 84 are connected to a positive D.C. voltage of +12 volts through a resistor 119 of 100 kilohms, and the collector of the switching transistor 42 is connected through an additional load resistor 120 of 4.3 kilohms in series with resistor 86 to a negative D.C. voltage source of −12 volts. As a result of the increased positive voltage applied to the cathodes of the clamping diodes, the D.C. voltage produced on the collector of the switching transistor, when such transistor is rendered conducting, is sufficiently positive to trigger the first tunnel diode 60, as well as forward bias the gating diode 74. This causes the ramp generator to "Free Run."

It will be obvious to those having ordinary skill in the art that many changes may be made in the details of the above-described preferred embodiment of the present invention without departing from the spirit of the invention. For example, the first and second tunnel diodes 60 and 106 could be replaced by other bistable multivibrators, and the second tunnel diode can be entirely eliminated, as discussed previously. Therefore, the scope of the present invention should only be determined by the following claims.

I claim:

1. A ramp generator circuit comprising:

signal generator means for producing linear ramp-shaped voltage signals;

a bistable circuit having its input connected to the input terminal of the circuit and having its output connected to said generator means to start the production of a ramp signal when said bistable circuit is triggered by a trigger pulse applied to said input terminal;

reverting means connected between the output of said generator means and the input of said bistable circuit for reverting said oscillator to its initial stable state when the ramp signal reaches a predetermined voltage level and for causing the ramp signal to return to its initial quiescent voltage;

gate means connected between the bistable circuit and the input terminal of the circuit for transmitting trigger pulses to said bistable circuit only when said gate means is conducting; and voltage comparator means including an electronic switch connected between the output of said generator means and said gate means for comparing the ramp voltage signal with a reference voltage to cause said switch to produce a disabling signal, for rendering said gate means nonconducting in response to the start of production of the ramp signal to prevent the transmission of said trigger pulses through said gate means during the generation of said ramp signal and for rendering said gate means again conducting only after the ramp signal has terminated and completely returned to its quiescent voltage.

2. A ramp generator circuit comprising:
signal generator means for producing linear ramp-shaped voltage signals when said generator receives a gating pulse;
a first bistable oscillator having its input connected to the input terminal of the circuit and having its output connected to said generator means to transmit a gating pulse to said generator means and start the production of a ramp signal after said first oscillator is triggered by a trigger pulse applied to said input terminal;
a second bistable oscillator having its input connected to the output of said generator means and having its output connected to the input of said first oscillator so that the leading edge of said ramp signal triggers said second oscillator at a predetermined voltage level and causes said second oscillator to revert the first oscillator in order to return the voltage of the ramp signal to its initial quiescent value, said second oscillator also being reverted when the ramp signal returns to said quiescent value;
gate means connected between the input of the first oscillator and the input terminal of the circuit for transmitting trigger pulses to said first oscillator only when said gate means is conducting; and
voltage comparator means including an electronic switch connected to the output of said generator means between a source of D.C. bias voltage and said gate means comparing the ramp voltage signal with a reference voltage to cause said switch to produce a disabling signal, for rendering said gate means nonconducting when the conductive condition of said switch is changed in response to the start of production of the ramp signal and for rendering said gate means again conducting only after the ramp signal has terminated and completely returned to its quiescent voltage and caused the switch means to return to its quiescent conductive condition.

3. A ramp generator circuit comprising:
signal generator means for producing linear ramp-shaped voltage signals;
a bistable oscillator having its input connected to the input terminal of the circuit and having its output connected to said generator means to start the production of a ramp signal when said oscillator is triggered by a trigger pulse applied to said input terminal;
coupling means connected between the output of said generator means and the input of said oscillator for reverting the oscillator to its inital stable state when the ramp signal reaches a predetermined voltage level and for causing the ramp signal to return to its initial quiescent voltage;
gate means connected between the oscillator and the input terminal of the circuit for transmitting trigger pulses to said oscillator only when said gate means is conducting;
an electronic switch means connected to the output of said generator means between a source of D.C. bias voltage and said gate means for quiescently biasing said gate means conducting, for rendering said gate means nonconducting when the conductive condition of said switch means is changed in response to the start of production of the ramp signal to prevent the transmission of said trigger pulses through said gate means during the generation of said ramp signal and for rendering said gate means again conducting only after the ramp signal has terminated and caused the switch means to return to its quiescent conductive condition; and
comparator means connected between the input of the signal generator means and said switch means to provide a negative feedback path from the output to the input of said generator means when said switch means is in its changed conductive condition, for comparing the output voltage of the generator means with a reference voltage to maintain the quiescent D.C. voltage of the ramp signal substantially constant and to prevent said switch means from rendering the gate means conducing before the ramp signal has completely returned to its quiescent voltage.

4. A ramp generator circuit comprising:
signal generator means for producing linear ramp-shaped voltage signals when said generator means receives a gating pulse;
a first bistable oscillator having its input connected to the input terminal of the circuit and having its output connected to said generator means to transmit a gating pulse to said generator means and start the production of a ramp signal when said first oscillator is triggered by a trigger pulse applied to said input terminal;
a second bistable oscillator having its input connected to the output of said generator means and having its output connected to the input of said first oscillator so that the leading edge of said ramp signal triggers said second oscillator at a predetermined voltage level and causes said second oscillator to revert the first oscillator in order to return the voltage of the ramp signal to its initial quiescent value, said second oscillator also being reverted when the ramp signal returns to said quiescent value;
gate means connected between the input of the first oscillator and the input terminal of the circuit for transmitting trigger pulses to said first oscillator only when said gate means is conducting;
a normally conducting electronic switch means connected to the output of said generator means between a source of D.C. bias voltage and said gate means for quiescently biasing said gate means conducting, for rendering said gate means nonconducting when said switch means is rendered nonconducting in response to the start of production of the ramp signal to prevent the transmission of trigger pulses through said gate means during the generation of said ramp signal and for rendering said gate means again conducting only after the ramp signal has terminated and caused the switch means to become conducting again; and
comparator means connected between the input of the signal generator means and said switch means to provide a negative feedback path from the output to the input of said generator means when said switch means is conducting for comparing the output voltage of the generator means with a reference voltage to maintain the quiescent D.C. voltage of the ramp signal substatially constant and to prevent said switch means from rendering said gate means conducting before the ramp signal has completely returned to its quiescent voltage.

5. A time base sweep generator circuit for a cathode ray oscilloscope comprising:
a Miller integrator circuit for producing a ramp voltage including a timing capacitance connected between the input and output of said integrator circuit and a charging resistance connected in series with said timing capacitance;
charging gate means connected to said charging resistance;
a pair of first and second bistable multivibrators;
means for connecting said first multivibrator between said charging gate means and the input terminal of the sweep generator circuit so that an input trigger pulse applied to said input terminal triggers said first multivibrator and renders said charging gate means nonconducting to start the generation of a ramp voltage;

means for connecting said second multivibrator being connected between the output of said integrator circuit and said first multivibrator so that said second multivibrator is triggered when the ramp voltage reaches a predetermined level and causes the first multivibrator to revert to its initial stable state and said charging gate means to be rendered conducting to return the ramp voltage to its quiescent value;

a normally conducting disabling gate means connected between the input terminal of the sweep generator circuit and said first multivibrator;

a normally conducting electronic switching device; and means for connecting said switching device to the output of said integrator circuit and to said disabling gate means so that the switching device is rendered nonconducting at the start of said ramp voltage and causes said disabling gate to become nonconducting to prevent input trigger pulses from being transmitted to said first multivibrator until the ramp voltage returns to its quiescent value and renders said switching device conducting again to cause the disabling gate to become conducting again.

6. A time base sweep generator circuit comprising:

a Miller integrator circuit for producing a ramp voltage including a timing capacitance connected between the input and output of said integrator circuit and a charging resistance connected in series with said timing capacitance;

a pair of normally conducting coupling diodes each connected to a different one of the end terminals of said timing capacitance, with one coupling diode connected in common with the charging resistance;

a pair of first and second tunnel diodes each connected as a bistable oscillator;

means for connecting said first tunnel diode between said one coupling diode and the input terminal of the sweep generator circuit so that an input trigger pulse applied to said input terminal triggers said first tunnel diode and renders said one diode nonconducting to start the generation of a ramp voltage;

means for connecting said second tunnel diode between the output of said integrator circuit and said first tunnel diode so that said second tunnel diode is triggered when the ramp voltage reaches a predetermined level and causes the first tunnel diode to revert to its initial stable state and said one coupling diode to be rendered conducting to return the ramp voltage to its quiescent value;

a normally conducting gating diode connected between the input terminal of the sweep generator circuit and said first tunnel diode;

a normally conducting switching transistor; and means for connecting the switching transistor through the other coupling diode to the output of said integrator circuit and for connecting said switching transistor to said gating diode so that the switching transistor is rendered nonconducting at the start of said ramp voltage and causes said gating diode to become nonconducting to prevent input trigger pusher from being transmitted to said first tunnel diode until the ramp voltage returns to its quiescent value and renders said switching transistor conducting again to cause the gating diode to become conducting again.

7. A time base sweep generator circuit comprising:

a Miller integrator circuit for producing a ramp voltage including a timing capacitance connected between the input and output of said integrator circuit and a charging resistance connected in series with said timing capacitance;

a pair of normally conducting coupling diodes each connected to a different one of the end terminals of said timing capacitance, with one coupling diode connected in common with the charging resistance;

a gating transistor having its output connected to said one coupling diode through a high frequency signal path and a separate low frequency signal path;

a pair of first and second tunnel diodes each connected as a bistable oscillator;

means for connecting said first tunnel diode between the input of said gating transistor and the input terminal of the sweep generator circuit so that an input trigger pulse applied to said input terminal triggers said first tunnel diode and renders said gating transistor and said one diode nonconducting to start the generation of a ramp voltage;

means for connecting said second tunnel diode between the ouput of said integrator circuit and said first tunnel diode so that said second tunnel diode is triggered when the ramp voltage reaches a predetermined level and causes the first tunnel diode to revert to its initial stable state and switch said gating transistor nonconducting and render said one coupling diode conducting to return the ramp voltage to its quiescent value;

a normally conducting gating diode connected between the input terminal of the sweep generator circuit and said first tunnel diode;

a normally conducting switching transistor;

means for connecting the emitter of said switching transistor to said gating transistor, its bases through the other coupling diode to the output of said integrator circuit and its collector to said gating diode so that the switching transistor is rendered nonconducting at the start of said ramp voltage and causes said gating diode to become nonconducting to prevent input trigger pulses from being transmitted to said first tunnel diode until the ramp voltage returns to its quiescent value and renders said switching transistor conducting again to cause the gating diode to become conducting again; and a comparator transistor connecting between the emitter of the switching transistor and said one coupling diode and having a D.C. reference voltage applied thereto to provide a negative voltage feedback path from the output to the input of the integrator circuit when the coupling diodes are conducting to maintain the quiescent D.C. voltage level at the output of the integrator circuit substantially constant and to prevent the switching transistor from being returned to a conducting state before the ramp voltage has terminated.

References Cited

UNITED STATES PATENTS

| | | | |
|---|---|---|---|
| 2,924,712 | 2/1960 | Edens | 307—88.5 X |
| 3,138,764 | 6/1964 | Dalton et al. | 307—88.5 X |
| 3,214,607 | 10/1965 | Rogers | 307—88.5 X |
| 3,215,948 | 11/1965 | Dalton | 307—88.5 X |

ARTHUR GAUSS, *Primary Examiner.*

D. D. FORRER, *Assistant Examiner.*